United States Patent
Seyama et al.

(10) Patent No.: US 11,616,041 B2
(45) Date of Patent: Mar. 28, 2023

(54) MOUNTING APPARATUS

(71) Applicant: SHINKAWA LTD., Tokyo (JP)

(72) Inventors: Kohei Seyama, Tokyo (JP); Tetsuya Utano, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 229 days.

(21) Appl. No.: 16/768,694

(22) PCT Filed: Nov. 28, 2018

(86) PCT No.: PCT/JP2018/043737
§ 371 (c)(1),
(2) Date: Jun. 1, 2020

(87) PCT Pub. No.: WO2019/107395
PCT Pub. Date: Jun. 6, 2019

(65) Prior Publication Data
US 2021/0175201 A1   Jun. 10, 2021

(30) Foreign Application Priority Data

Dec. 1, 2017 (JP) .............................. JP2017-232106

(51) Int. Cl.
*H01L 23/00* (2006.01)
*B65G 47/91* (2006.01)
(Continued)

(52) U.S. Cl.
CPC ............ *H01L 24/75* (2013.01); *B65G 47/912* (2013.01); *B65H 18/145* (2013.01); *B65H 18/16* (2013.01);
(Continued)

(58) Field of Classification Search
None
See application file for complete search history.

(56) References Cited

U.S. PATENT DOCUMENTS 5,668,700 A * 9/1997 Tagusa ................ H01L 23/5387
361/767
6,347,655 B1 * 2/2002 Yamamoto .............. H01L 24/75
156/583.1
(Continued)

FOREIGN PATENT DOCUMENTS

JP   2004165536   6/2004
JP   2015035493   2/2015
(Continued)

OTHER PUBLICATIONS

"International Search Report (Form PCT/ISA/210) of PCT/JP2018/043737," dated Jan. 15, 2019, with English translation thereof, pp. 1-4.

*Primary Examiner* — Steven M Christopher
(74) *Attorney, Agent, or Firm* — JCIPRNET

(57) ABSTRACT

A mounting apparatus includes: a bonding stage; a base; a mounting head for performing a temporary press-attachment process in which semiconductor chips are suction-held and temporarily press-attached to a mounted object and a final press-attachment process in which the temporarily press-attached semiconductor chips are finally press-attached; a film arrangement mechanism arranged on the bonding stage or the base; and a controller which controls driving of the mounting head and the film arrangement mechanism. The film arrangement mechanism includes: a film feed-out mechanism which has a pair of feed rollers with a cover film extended there-between and successively feeds out a new cover film; and a film movement mechanism which moves the cover film in a horizontal direction with respect to a substrate.

7 Claims, 13 Drawing Sheets

(51) Int. Cl.
*B65H 18/14* (2006.01)
*B65H 18/16* (2006.01)

(52) U.S. Cl.
CPC ...... *H01L 24/83* (2013.01); *H01L 2224/7555* (2013.01); *H01L 2224/75745* (2013.01); *H01L 2224/83203* (2013.01); *H01L 2224/83855* (2013.01)

(56) References Cited

U.S. PATENT DOCUMENTS

| | | | |
|---|---|---|---|
| 11,296,048 B2* | 4/2022 | Nakamura | H01L 24/81 |
| 2007/0275544 A1* | 11/2007 | Maki | H01L 24/83 |
| | | | 438/464 |
| 2012/0043005 A1* | 2/2012 | Yamakami | H01L 24/75 |
| | | | 156/60 |
| 2015/0050778 A1 | 2/2015 | Asahi et al. | |
| 2016/0276205 A1* | 9/2016 | Huska | H01L 21/67132 |
| 2018/0226376 A1* | 8/2018 | Huska | H01L 21/6836 |
| 2021/0175201 A1* | 6/2021 | Seyama | B65H 18/16 |

FOREIGN PATENT DOCUMENTS

| | | |
|---|---|---|
| JP | 2017123423 | 7/2017 |
| WO | 2013133015 | 9/2013 |
| WO | 2016125763 | 8/2016 |

\* cited by examiner

MOUNTING APPARATUS

CROSS-REFERENCE TO RELATED APPLICATION

This application is a 371 application of the International PCT application serial no. PCT/JP2018/043737, filed on Nov. 28, 2018, which claims the priority benefits of Japan Patent Application No. 2017-232106, filed on Dec. 1, 2017. The entirety of each of the above-mentioned patent applications is hereby incorporated by reference herein and made a part of this specification.

BACKGROUND OF THE INVENTION

Technical Field

The specification discloses a mounting apparatus that mounts semiconductor chips onto a mounted body which is a substrate or another semiconductor chip via an adhesive material.

Related Art

Conventionally, a flip chip bonder technique for mounting semiconductor chips onto a mounted body which is a substrate or another semiconductor chip without a wire is widely known. In this flip chip bonder, an adhesive material made of a thermosetting resin may be coated to a mounted body in advance, and the semiconductor chips are fixed to the mounted body via the adhesive material. In this case, when the semiconductor chips are heated and pressurized by the mounting head, the adhesive material extruded by the semiconductor chips may be crawled upward and adhered to the mounting head. In addition, even when the adhesive material is not adhered to the mounting head, fume gas generated from the heated adhesive material may enter the mounting head.

In patent literature 1, a mounting apparatus is disclosed in which a bottom surface of a thermo-compression bonding tool is covered with a film member (cover film) in order to prevent the adhesive material from being adhered to the thermo-compression bonding tool (mounting head). That is, in the mounting apparatus of patent literature 1, the thermo-compression bonding tool and a film member transport mechanism for sequentially feeding the film members are arranged in the bonding head. According to this mounting apparatus, adhesion of the adhesive material to the thermo-compression bonding tool is effectively prevented.

LITERATURE OF RELATED ART

Patent Literature

Patent literature 1: Japanese Patent Laid-Open No. 2015-35493
Patent literature 2: Japanese Patent Laid-Open No. 2004-165536

SUMMARY

Problems to be Solved

However, in the related art such as patent literature 1 and the like, the semiconductor chips are suction-held on the bottom surface of the thermo-compression bonding tool, and the suction surface is always covered with the film member. Besides, the film member is replaced with a new film member each time one semiconductor chip is compressed. As a result, in the related art, it is necessary to form a suction hole in the film member prior to the suction of the semiconductor chips. Here, compared with the time required to heat and pressurize the semiconductor chips and bond the semiconductor chips to the mounted body, the time required for the opening of the hole in the film member and the feed of the film member is several to ten times. Therefore, in the related arts such as patent literature 1 and the like, the tact time is increased.

Moreover, in patent literature 2, a mounting apparatus is disclosed in which a resin film (cover film) is arranged separately from a joining tool. However, in the mounting apparatus of patent literature 2, the resin film is configured for protecting chips (semiconductor chips) from vibration of the joining tool, but not for preventing the adhesive material from being adhered to the joining tool. In addition, although the joining tool disclosed in patent literature 2 presses an already temporarily placed chip, the joining tool does not suction-hold and temporarily place the chip before the temporary placement. Therefore, the technique of patent literature 2 is difficult to apply to a mounting apparatus that performs temporary press-attachment and final press-attachment of semiconductor chips with one mounting head.

Therefore, in the specification, a mounting apparatus is disclosed that performs a temporary press-attachment process and a final press-attachment process with one mounting head and that can further shorten the tact time.

Means to Solve Problems

The mounting apparatus disclosed in the specification mounts a semiconductor chip to a mounted body which is a substrate or another semiconductor chip via an adhesive material, and includes: a bonding stage on which the substrate is placed; a base supporting the bonding stage; a mounting head for performing a temporary press-attachment process in which the semiconductor chip is suction-held and temporarily press-attached to the mounted body and a final press-attachment process in which the temporarily press-attached semiconductor chip is finally press-attached; a film arrangement mechanism which is arranged on the bonding stage or the base and interposes a cover film between the temporarily press-attached semiconductor chip and the mounting head at the time of the final press-attachment process; and a controller which controls a driving of the mounting head and the film arrangement mechanism, wherein the film arrangement mechanism includes: a film feed-out mechanism which has a pair of rollers with the cover film extended there-between and successively feeds out a new cover film; and a film movement mechanism moving the cover film in a horizontal direction with respect to the substrate.

In this configuration, because the cover film and the mounting head are separated from each other, holes are not necessary to be made in the cover film. As a result, the tact time is reduced and contamination to the mounting head caused by the adhesive material can be effectively prevented.

The controller may control the film movement mechanism in a manner that, during the temporary press-attachment process, the cover film is positioned at a retracted position horizontally separated from mounting sections where the semiconductor chip is temporarily press-attached, and during the final press-attachment process, the cover film is positioned at an intermediate position directly above the semiconductor chip to be finally press-attached.

With this configuration, at the time of the temporary press-attachment process, the interference between the cover film and the mounting head is prevented, and at the time of the final press-attachment process, because the cover film is interposed between the mounting head and the semiconductor chip, the contamination to the mounting head caused by the adhesive material is effectively prevented.

In addition, the film feed-out mechanism may extend the cover film in a manner that the cover film covers a plurality of the mounting sections from above in the intermediate position; and when the final press-attachment of the semiconductor chip is completed in all of the plurality of mounting sections covered by the cover film, the controller may drive the film movement mechanism and moves the film movement mechanism to the position where the cover film covers a plurality of new mounting sections from above, and the controller drives the film feed-out mechanism and feeds the cover film by a distance corresponding to the plurality of mounting sections.

With this configuration, the number of times for feeding the cover film can be reduced, and thus the tact time can be further reduced.

In this case, the mounting sections for mounting the semiconductor chip may be defined in a two-dimensional array shape on the substrate, and the film feed-out mechanism may extend the cover film to cover the two-dimensional array-shaped mounting sections in columns.

The control of the feed and the movement of the cover film can be simplified by the cover film covering the mounting sections in columns.

In addition, the controller may cause the mounting head to continuously execute the temporary press-attachment of the semiconductor chips in the plurality of mounting sections, and then cause the mounting head to continuously execute the final press-attachment of the plurality of temporarily press-attached semiconductor chips.

With this configuration, the number of times for moving the cover film by the film movement mechanism can be reduced, and thus the tact time can be further reduced.

In addition, the film arrangement mechanism may further include an elevating mechanism which elevates or lowers the cover film with respect to the bonding stage.

With this configuration, the cover film can be more reliably separated from upper surfaces of the semiconductor chips. In addition, when the semiconductor chips are laminated and mounted, an arrangement height of the cover film can be changed according to the number of the laminated layers, and thus versatility of the mounting apparatus is improved.

In addition, the film feed-out mechanism may include an interference member which interferes with a part of the cover film pressed and bent downward by the mounting head to thereby assist in eliminating the bending.

With this configuration, the cover film can have a simple configuration and be more reliably separated from the upper surfaces of the semiconductor chips.

Effect

According to the mounting apparatus disclosed in the specification, because the cover film and the mounting head are separated from each other, holes are not necessary to be made in the cover film. As a result, the tact time is reduced and the contamination to the mounting head caused by the adhesive material can be effectively prevented.

DESCRIPTION OF THE EMBODIMENTS

Figure 1:
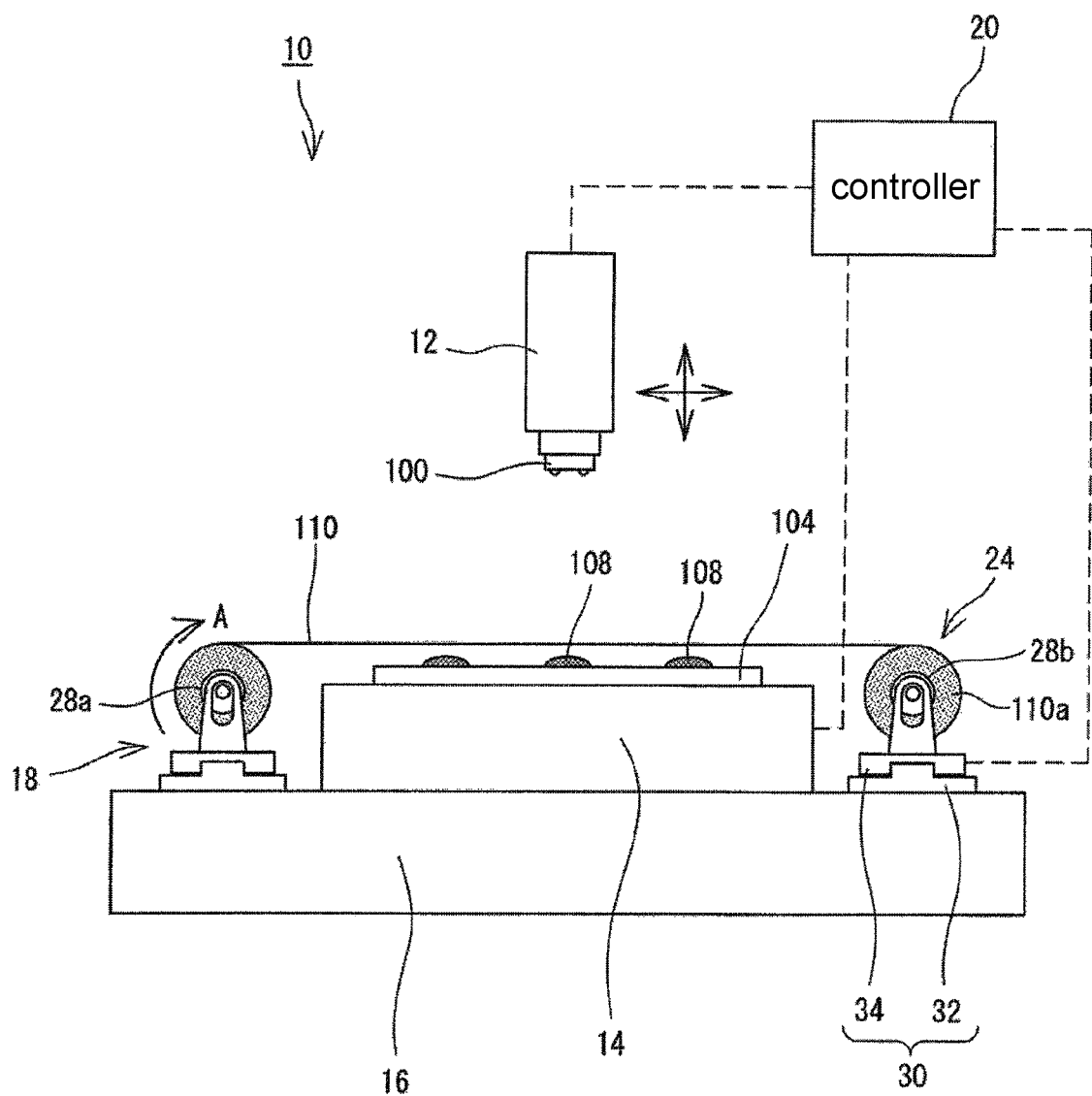
FIG. 1 is a diagram showing the configuration of a mounting apparatus.
Figure 2:
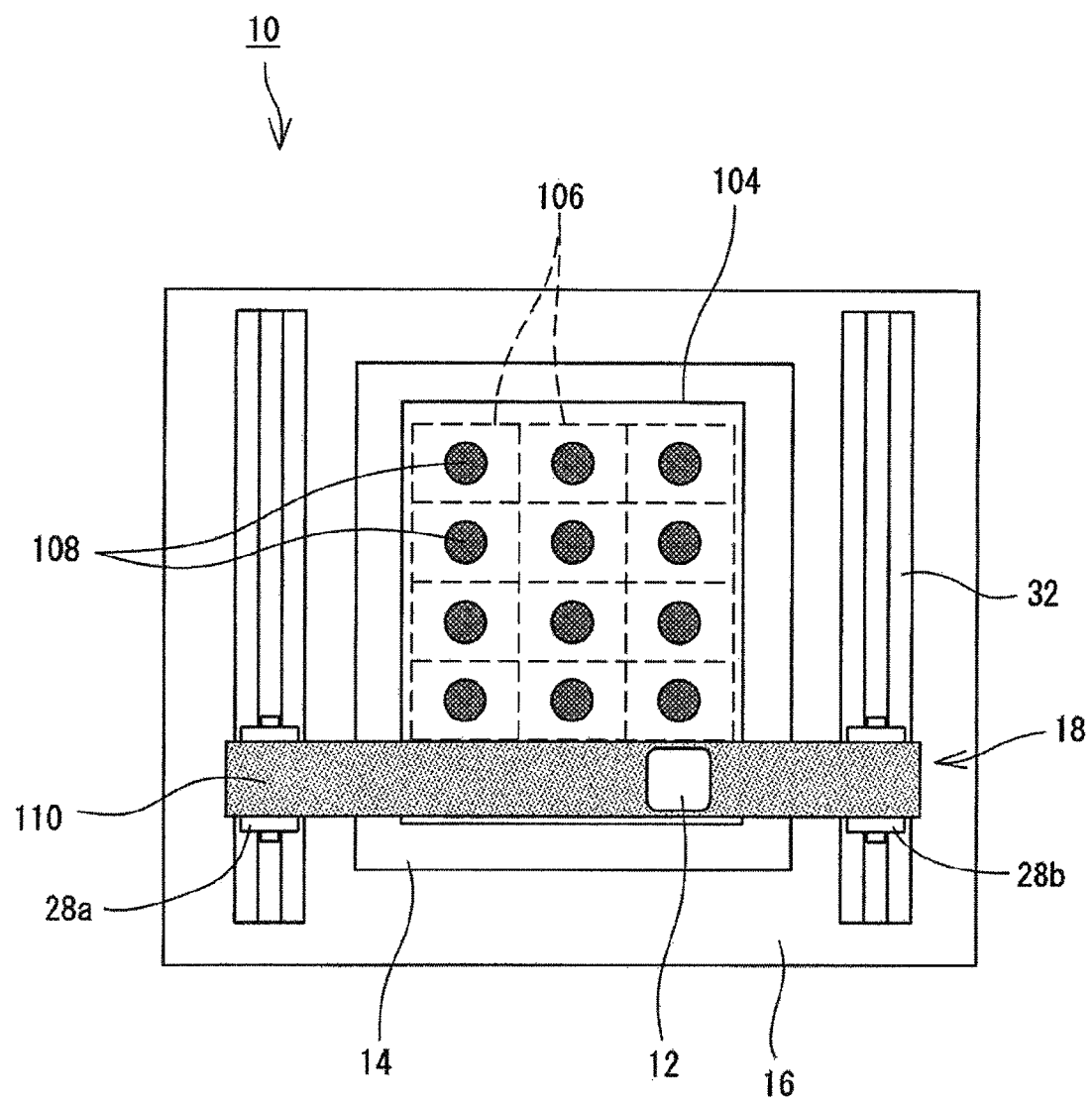
FIG. 2 is a schematic plan view of the mounting apparatus.
Figure 3:
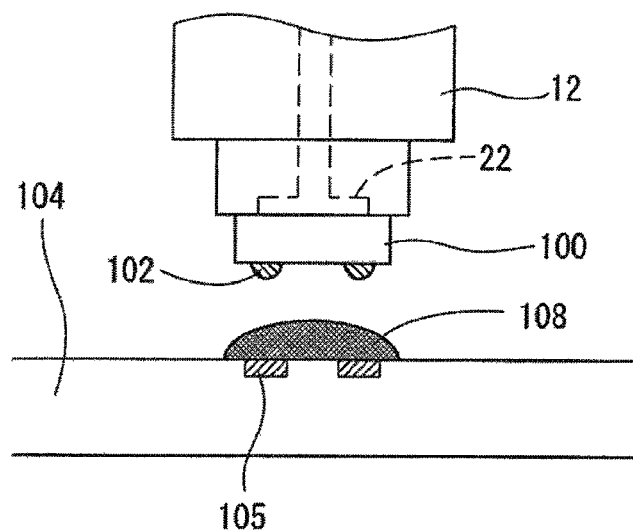
FIG. 3 is a side view showing a situation of temporary press-attachment.
Figure 4:
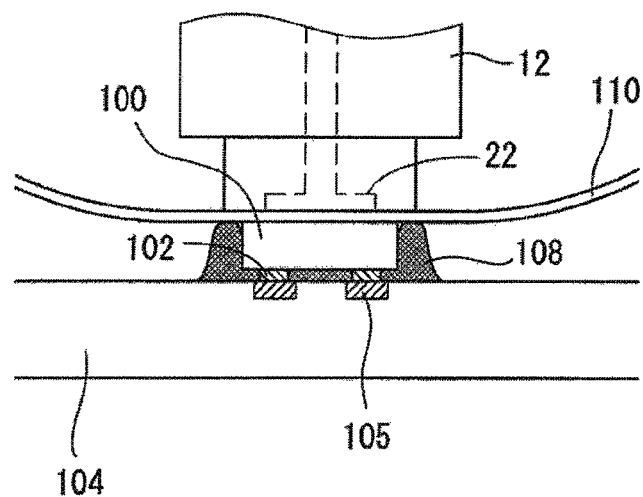
FIG. 4 is a side view showing a situation of final press-attachment.

The configuration of a mounting apparatus 10 is described below with reference to the drawings. FIG. 1 is a schematic diagram showing the configuration of the mounting apparatus 10. FIG. 2 is a schematic plan view of the mounting apparatus 10. In addition, FIG. 3 is a diagram showing a situation of a temporary press-attachment process, and FIG. 4 is a diagram showing a situation of a final press-attachment process.

The mounting apparatus 10 is an apparatus which manufactures a semiconductor apparatus by mounting a plurality of semiconductor chips 100 on a substrate 104 or another semiconductor chip 100 (hereinafter, referred to as "the mounted body" when the two are not distinguished from each other). The semiconductor chips 100 are mounted onto the substrate 104 by a flip chip bonder technique. Specifically, a protrusion made of a conductive material and called a bump 102 is formed on a bottom surface of each semiconductor chip 100, the bump 102 is joined to an electrode 105 formed on a surface of the substrate 104, and thereby the semiconductor chips 100 and the substrate 104 are electrically connected.

On the substrate 104, mounting sections 106 for mounting the semiconductor chips 100 are defined in a two-dimensional array shape. In the illustrated example, fifteen mounting sections 106 are defined on one substrate 104 in three rows and five columns. On the surface of each mounting section 106, a plurality of the electrodes 105 electrically connected to the bumps 102 of the semiconductor chips 100 is formed. In addition, an adhesive material 108 called a non-conductive paste (NCP) or a non-conductive film (NCF) is coated to each mounting section 106 in advance. The adhesive material 108 is made of a thermosetting resin having an insulation property and a thermosetting property. The semiconductor chips 100 are placed on the adhesive material 108 and pressed against the substrate 104, and the semiconductor chips 100 are heated Thereby, the adhesive material 108 is cured, and the semiconductor chips 100 are mechanically bonded and fixed to the substrate 104. Moreover, the method of coating the adhesive material 108 in advance to the substrate 104 in this manner is generally referred to as a "coating first method".

The mounting apparatus 10 temporarily press-attaches each semiconductor chip 100, and then mounts each semiconductor chip 100 to the substrate 104 by final press-attachment. In the temporarily press-attachment, the semiconductor chips 100 are temporarily placed on corresponding mounting sections 106 (the adhesive material 108) of the substrate 104. In addition, in the final press-attachment, the temporarily press-attached semiconductor chips 100 are heated and pressurized to thereby be mechanically or electrically connected to the mounted body (the substrate 104 or another semiconductor chip 100). At the time of the final press-attachment, the semiconductor chips 100 are heated at a temperature equal to or higher than the curing temperature of the adhesive material 108 and equal to or higher than the melting temperature of the bump 102. In the example, in the plurality of mounting sections 106, after the temporary press-attachment of the semiconductor chips 100 is continuously executed, the final press-attachment of the plurality of temporarily press-attached semiconductor chips 100 is continuously executed.

The mounting apparatus 10 is an apparatus for mounting the semiconductor chips 100 onto the substrate 104 (the mounted body) according to the above-described procedure. The mounting apparatus 10 includes a bonding stage 14, a mounting head 12, a base 16, a film arrangement mechanism 18, and a controller 20 for controlling the driving of these units.

The bonding stage 14 is a stage on which the substrate 104 is placed. The bonding stage 14 includes, for example, a suction hole (not shown) for suction-holding the substrate 104, a heater (not shown) for heating the substrate 104, and the like. The bonding stage 14 is supported by the base 16.

The mounting head 12 is arranged to face the bonding stage 14 and is movable in horizontal and vertical directions with respect to the bonding stage 14. The mounting head 12 performs the temporary press-attachment process and the final press-attachment process. In the temporary press-attachment process, the mounting head 12 receives the semiconductor chips 100 from a chip supply source (not shown), transports the semiconductor chips 100 and places each semiconductor chip 100 in the corresponding mounting section 106, and then heats and pressurizes to temporarily press-attach the semiconductor chips 100. A heating temperature at the time of the temporary press-attachment is desirably equal to or higher than a temperature at which the adhesive material starts to soften and equal to or lower than the curing temperature of the adhesive material 108. In addition, in the final press-attachment process, the mounting head 12 pressurizes and heats the semiconductor chips 100 temporarily press-attached on the substrate 104 to perform the final press-attachment. A heating temperature at the time of the final press-attachment is desirably equal to or higher than the melting temperature of the bump 102 and equal to or higher than the curing temperature of the adhesive material 108. In addition, a pressurizing force at the time of the final press-attachment is greater than a pressurizing force at the time of the temporary press-attachment.

As shown in FIG. 3, a suction hole 22 for suction-holding the semiconductor chip 100 is formed on the bottom surface of the mounting head 12. The suction hole 22 is communicated with a suction pump (not shown), and the semiconductor chip 100 is suction-held on the bottom surface of the mounting head 12 by a negative pressure generated by the suction pump. In addition, the mounting head 12 has a built-in heater (not shown) for heating the semiconductor chip 100 at the time of the temporary press-attachment and the final press-attachment. Moreover, in the example, the mounting head 12 is moved in the horizontal direction; however, the bonding stage 14 may be moved in the horizontal direction as described later.

Meanwhile, as described above, the mounting head 12 presses the semiconductor chip 100 against the substrate 104 at the time of the final press-attachment. At this time, as shown in FIG. 4, a part of the adhesive material 108 extruded outward by the semiconductor chip 100 may protrude and crawl upward. If the adhesive material 108 crawling upward is adhered to the mounting head 12, the subsequent mounting process may not be performed properly. In addition, even when the adhesive material 108 is not adhered to the mounting head 12, fume gas generated from the heated adhesive material 108 may enter the suction hole 22 of the mounting head 12, and the mounting head 12 may be contaminated accordingly.

Therefore, in the mounting apparatus 10 disclosed in the specification, at the time of the final press-attachment, a cover film 110 is interposed between the mounting head 12 and the semiconductor chip 100. As shown in FIG. 4, by arranging this the cover film 110, the adhesion of the adhesive material 108 to the mounting head 12 and the entering of the fume gas into the suction hole 22 of the mounting head 12 are effectively prevented.

On the base 16 of the mounting apparatus 10, the film arrangement mechanism 18 is set which interposes the cover film 110 between the temporarily press-attached semiconductor chip 100 and the mounting head 12 at the time of the final press-attachment process. In the example, the band-shaped cover film 110 that is long in one direction is used. As the material of the cover film 110, a material having excellent heat resistance and high detachability from the adhesive material 108 is suitable. Therefore, for example, a fluoro resin such as polytetrafluoroethylene (PTFE), tetrafluoroethylene-perfluoroalkylvinylether copolymer (PFA) or the like can be used as the material of the cover film 110.

The film arrangement mechanism 18 has a film feed-out mechanism 24 for sequentially feeding out the band-shaped cover film 110 above the substrate 104. The film feed-out mechanism 24 includes a feed-out roller 28a and a winding roller 28b (hereinafter, simply referred to as the "feed rollers" when the feed-out roller 28a and the winding roller 28b are not distinguished) arranged on two sides clamping the bonding stage 14. The cover film 110 is extended between the pair of feed rollers. The feed-out roller 28a rotates in a predetermined feed-out direction (a direction of an arrow A in FIG. 1), and thereby new cover films 110 are sequentially fed out. In addition, the winding roller 28b rotates in the same direction as the feed-out roller 28a in conjunction with the feed-out roller 28a, and thereby the used cover film 110 is wound up and recovered by the winding roller 28b. That is, the cover film 110 is fed by the rotation of the pair of feed rollers in the same direction.

Here, as described above, the pair of feed rollers is arranged on both sides of the bonding stage 14, and thus the cover film 110 crosses the substrate 104 in one direction. In addition, the cover film 110 is sufficiently wider than the width of the mounting section 106. Therefore, the cover film 110 can cover above one column of mounting sections 106 of the mounting sections 106 arranged in three rows and five columns, that is, the cover film 110 can cover above a plurality (three in the illustrated example) of the mounting sections 106.

The winding roller 28b is coupled to a drive source such as a motor or the like and is a drive roller that is rotated with the drive of the motor or the like. The feed-out roller 28a may be a drive roller that can be rotated independently of the winding roller 28b or a driven roller that is rotated with the rotation of the winding roller 28b. When the feed-out roller 28a is a driven roller, an urging member is desirably arranged, the urging member being capable of urging the feed-out roller 28a in a direction opposite to the feed-out direction in a manner that an appropriate tension can be applied to the cover film 110 to be extended therebetween. In addition, in any embodiment, a sensor that senses an amount of the cover film 110 wound around each feed roller is desirably arranged near at least one of the two feed rollers. Then, according to a detection result of the sensor, a replacement time of the cover film 110 may be estimated, or a rotation speed of the feed roller may be adjusted. Particularly, a feed-out/winding distance (feeding amount) of the cover film 110 in one rotation of the feed rollers is changed corresponding to the amount of the cover film 110 wound around each feed roller (more precisely, the diameter of a film roll 110a formed by winding the cover film 110 around each feed roller). Thus, in order to appropriately control the feeding amount of the cover film 110, the tension of the cover film 110, and the like, the number of the rotation of the feed rollers is desirably adjusted corresponding to the amount of the cover film 110 wound around each feed roller.

The film arrangement mechanism 18 further includes a film movement mechanism 30 for moving the cover film 110 in the horizontal direction together with the film feed-out mechanism 24. The film movement mechanism 30 includes a pair of rails 32 extending in a first direction (in the illustrated example, the long direction of the rectangular substrate 104), and movement blocks 34 that slide along the rails 32. The pair of rails 32 is arranged on two sides clamping the bonding stage 14. The feed rollers are arranged on the movement blocks 34, and the feed rollers and the cover film 110 are moved in the first direction as the movement blocks 34 slide. Moreover, the two movement blocks 34 attached to the two rails 32 are moved in conjunction in a manner that relative positions of the feed-out roller 28a and the winding roller 28b are always fixed. The feed rollers are moved in the first direction by the film movement mechanism 30, and thereby the mounting sections 106 (the semiconductor chips 100) covered with the cover film 110 are sequentially changed. Moreover, the mechanism making the movement blocks 34 slide may be, for example, a mechanism in which a motor (rotary electric machine) and a ball spline are combined, or a mechanism using a direct-acting drive source such as a hydraulic cylinder or a linear motor.

The film arrangement mechanism 18 further includes a film elevating mechanism (not shown) for elevating and lowering the cover film 110 together with the film feed-out mechanism 24. The film elevating mechanism is not particularly limited as long as the mechanism can change the height of the feed rollers. Therefore, the film elevating mechanism may include, for example, cam members that are rotated in contact with rotation shafts of the feed rollers. In addition, as another embodiment, the film elevating mechanism may be configured to have a moving body that is connected to the rotation shafts of the feed rollers and movable in the vertical direction by a driving source such as a motor or a hydraulic cylinder. In any case, the film elevating mechanism positions the cover film 110 in a height direction with respect to the substrate 104 and the semiconductor chip 100.

The controller 20 controls the driving of the mounting head 12, the film arrangement mechanism 18 and the bonding stage 14 described above. The controller 20 includes, for example, a CPU that performs various calculations, and a memory that stores various data and programs. Detection results of various sensors are input to the controller 20, and the controller 20 controls the driving of each unit according to the detection results. More specifically, the controller 20 controls the movement of the mounting head 12, or controls the temperatures of heaters of the mounting head 12 and the bonding stage 14, the driving of the suction mechanism, and the like. In addition, the controller 20 also controls the driving of the film arrangement mechanism 18 in order to arrange the cover film 110 at an appropriate position.

Figure 5:
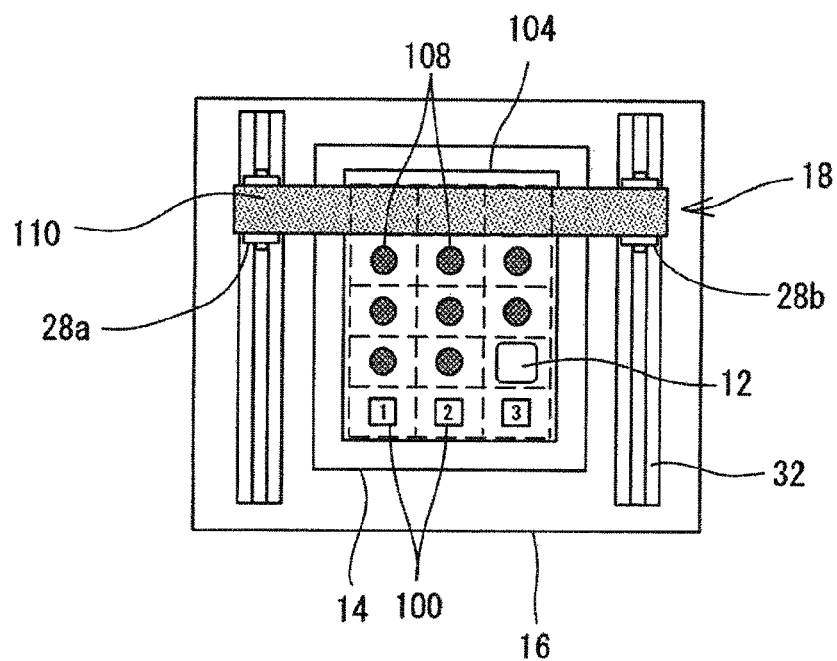
FIG. 5 is a plan view showing a situation of the temporary press-attachment.
Figure 6:
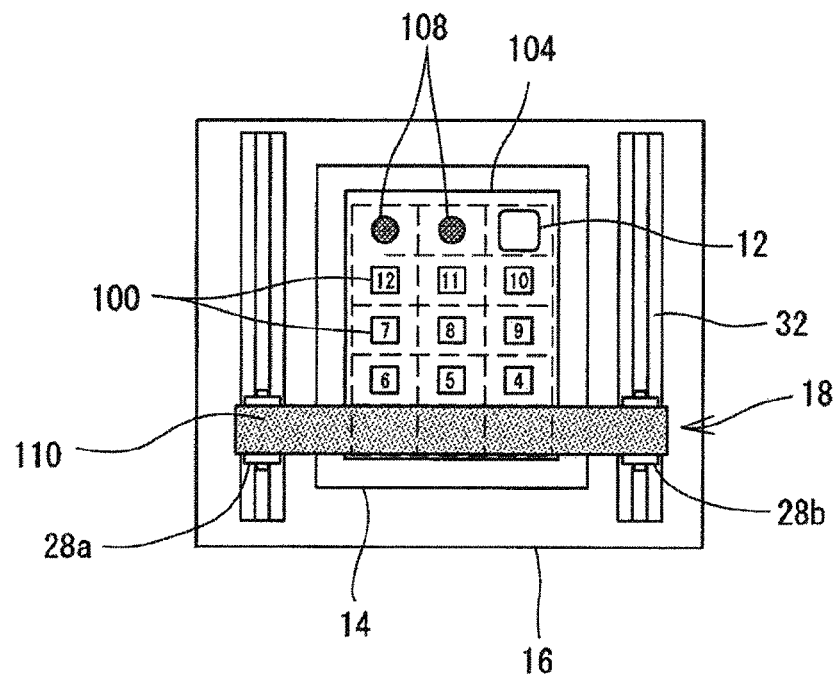
FIG. 6 is a plan view showing a situation of the temporary press-attachment.
Figure 7:
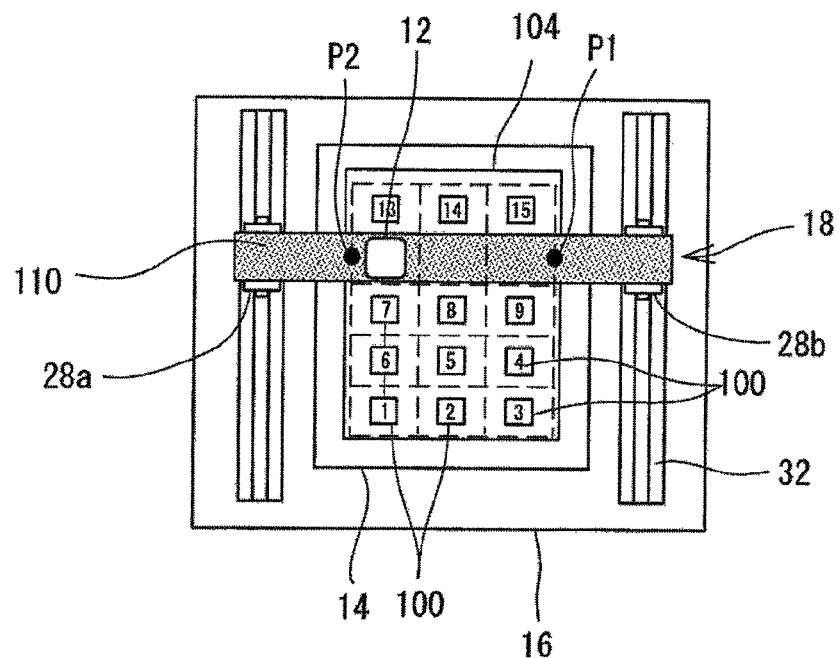
FIG. 7 is a plan view showing a situation of the final press-attachment.
Figure 8:
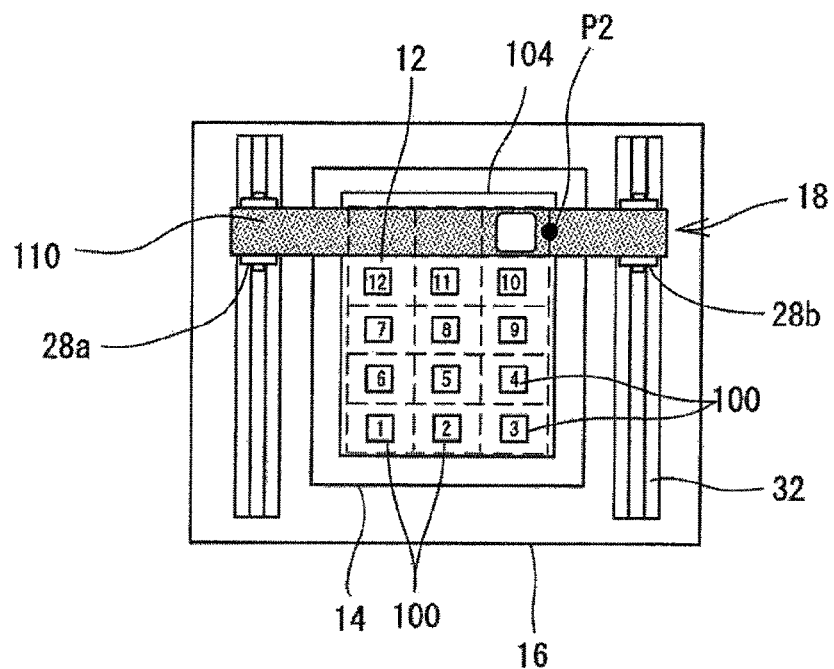
FIG. 8 is a plan view showing a situation of the final press-attachment.

Next, the flow of mounting the semiconductor chip 100 by the mounting apparatus 10 is described with reference to FIGS. 3 to 8. FIGS. 5 to 8 are schematic plan views showing situations during the mounting, FIGS. 5 and 6 show situations of the temporary press-attachment, and FIGS. 7 and 8 show situations of the final press-attachment. When the semiconductor chip 100 is mounted, the substrate 104 is placed on the bonding stage 14. The adhesive material 108 is coated to the mounting sections 106 of the substrate 104 in advance or after the substrate 104 is placed on the bonding stage 14.

The controller 20 drives the mounting head 12 to temporarily press-attach the semiconductor chips 100 onto each mounting section 106 of the substrate 104. Specifically, the mounting head 12 is moved to a chip supply source which is not shown and suction-holds a new semiconductor chip on the bottom surface of the mounting head 12. Subsequently, the mounting head 12 is moved just above the corresponding mounting section 106. Thereafter, as shown in FIG. 3, the mounting head 12 is lowered toward the substrate 104, presses the suction-held semiconductor chip 100 against the corresponding mounting section 106 (and then the adhesive material 108), and thereby temporarily press-attaches the semiconductor chip 100. If one semiconductor chip 100 can be temporarily press-attached, the mounting head 12 is lifted after the suction of the semiconductor chip 100 is released. Thereafter, the mounting head 12 successively performs the temporary press-attachment of all the semiconductor chips 100 in the same procedure. In FIGS. 5 and 6, the numbers given to the respective semiconductor chips 100 indicate the order of the temporary press-attachment. As is clear from FIGS. 5 and 6, in the illustrated example, the semiconductor chips 100 are temporarily press-attached from the lower left corner. Then, the temporary press-attachment of the semiconductor chips 100 is performed in a zigzag manner while reversing the traveling direction for each column.

Here, at the time of the temporary press-attachment process, the controller 20 drives the film movement mechanism 30 to move the cover film 110 to the retracted position. The retracted position is a position horizontally separated from the mounting section 106 in which the semiconductor chip 100 is temporarily press-attached. The retracted position may be a specific fixing position or a variable position that is changed in accordance with a change in the mounting section 106 to be temporarily press-attached to. For example, if the cover film 110 can be moved to the outside of the substrate 104, the outside of the substrate 104 may be set as the retracted position. If the cover film 110 is positioned outside the substrate 104, the cover film 110 will be horizontally separated from the mounting section 106 to be temporarily press-attached to, no matter which mounting section 106 is temporarily press-attached to. Therefore, the outside of the substrate 104 is a position-invariant retracted position.

On the other hand, the cover film 110 may not be able to be moved to the outside of the substrate 104 due to restrictions on the size and the like of the mounting apparatus 10. In this case, a position just above a mounting section 106 where the temporary press-attachment is not performed at this time may be set as the retracted position. For example, as shown in FIG. 5, the mounting sections 106 of the substrate 104 are divided into three columns on one side (three columns on the lower side in the drawing) and two columns on the opposite side (two columns on the upper side in the drawing). During the temporary press-attachment on the three columns on one side, the position just above the two columns on the opposite side may be set as the retracted position (see FIG. 5), and during the temporary press-attachment on the two columns on the opposite side, the position just above the three columns on one side may be set as the retracted position (see FIG. 6). That is, in this case, the film movement mechanism 30 moves the cover film 110 to the position just above the two columns on the opposite side during the temporary press-attachment on the three columns on one side, and slides the movement blocks 34 to move the cover film 110 to the position just above the three columns on the opposite side when the temporary press-attachment on the three columns on one side is completed. In any case, during the temporary press-attachment process, the cover film 110 is horizontally separated from the mounting section 106 to be temporarily press-attached to. Thereby, the interference between the cover film 110 and the mounting head 12 can be prevented, and the semiconductor chips 100 can be appropriately temporarily press-attached.

If all the semiconductor chips 100 are temporarily press-attached, the controller 20 subsequently causes the mounting head 12 to execute the final press-attachment process. Specifically, the mounting head 12 successively pressurizes and heats the temporarily press-attached semiconductor chips 100 and finally press-attaches the temporarily press-attached semiconductor chips 100 to the substrate 104. In FIGS. 7 and 8, the numbers given to each semiconductor chip 100 indicate the order of the final press-attachment. In the illustrated example, similarly to the temporary press-attachment, the final press-attachment is also started from the lower left corner, and proceeds thereafter in a zigzag manner while reversing the traveling direction for each column.

Here, at the time of the final press-attachment process, the controller 20 drives the film movement mechanism 30 to move the cover film 110 to an intermediate position. The intermediate position is a position just above the semiconductor chip 100 to be finally press-attached and between the semiconductor chip 100 and the mounting head 12. By disposing the cover film 110 in this position, the cover film 110 is interposed between the semiconductor chip 100 and the mounting head 12 at the time of the final press-attachment, as shown in FIG. 4. Thereby, the adhesive material 108 that has crawled up can be effectively prevented from being adhered to the mounting head 12 and the fume gas can be effectively prevented from entering the mounting head 12.

Here, the semiconductor chips 100 to be finally press-attached are successively changed. Therefore, the position of the cover film 110 is required to be sequentially changed according to the traveling situation of the final press-attachment process. However, in the example, the cover film 110 is extended to cover one column (three) of the semiconductor chips 100 (the mounting sections 106). Therefore, the film movement mechanism 30 does not move the cover film 110 until the one column (three) of semiconductor chips 100 positioned just below the cover film 110 are finally press-attached, and if all the semiconductor chips 100 positioned just below the cover film 110 have been finally press-attached, the cover film 110 is moved to a position just above the next adjacent column. According to the example of FIGS. 7 and 8, when semiconductor chips 100 in the second column from the top of the drawing are finally press-attached, the film movement mechanism 30 makes the cover film 110 be positioned just above the second column of the mounting sections 106 as shown in FIG. 7. In addition, as shown in FIG. 8, when the final press-attachment of all the semiconductor chips 100 in the second column is completed, the film movement mechanism 30 moves the cover film 110 to the position just above the mounting sections 106 in the first row from the top of the drawing.

In addition, in conjunction with the horizontal movement of the cover film 110 by the film movement mechanism 30, the film feed-out mechanism 24 feeds the cover film 110. Specifically, the film feed-out mechanism 24 feeds the cover film 110 by a distance corresponding to one column of the mounting sections 106 when the final press-attachment of the semiconductor chips 100 for one column is completed. In the example of FIG. 7, a position P1 on the cover film 110 is positioned near one end of the column of the mounting sections 106, and a position P2 on the cover film 110 is positioned near the other end of the column. The distance from the position P1 to the position P2 is the distance for one feed.

When the cover film 110 is moved from the second row to the first row as viewed from above (when the state of FIG. 7 is changed to the state of FIG. 8), as shown in FIG. 8, the film feed-out mechanism 24 feeds the cover film 110 in a manner that the position P2 on the cover film 110 is near the one end of the column of the mounting sections 106.

Moreover, when the semiconductor chip 100 is heated and pressurized by the mounting head 12 via the cover film 110, as shown in FIG. 4, the cover film 110 is in close contact with the upper surface of the semiconductor chip 100, and a part of the adhesive material 108 that has crawled up comes into contact with the cover film 110. The cover film 110 cannot be appropriately fed while the cover film 110 is kept in close contact with the upper surface of the semiconductor chip 100.

Figure 9A:
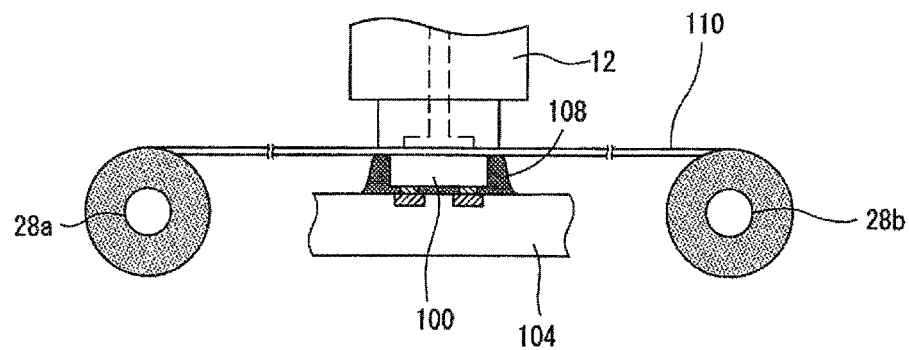
FIG. 9A is a side view showing a situation of the final press-attachment.
Figure 9B:
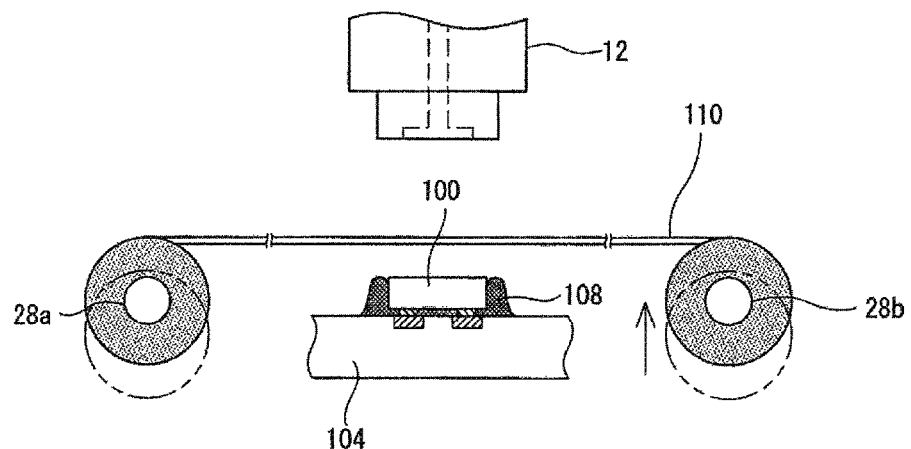
FIG. 9B is a side view showing a situation of the final press-attachment.

Therefore, if necessary, the cover film 110 may be elevated or lowered by the film elevating mechanism. Specifically, when the semiconductor chip 100 is finally press-attached, as shown in FIG. 9A, the cover film 110 is lowered by the film elevating mechanism in a manner that the cover film 110 is at substantially the same height position as the upper surface of the semiconductor chip 100. In addition, when the cover film 110 is fed, as shown in FIG. 9B, the cover film 110 is elevated by the film elevating mechanism in a manner that the cover film 110 is separated from the upper surface of the semiconductor chip 100.

That is, in the final press-attachment process, each time the final press-attachment to one column of the mounting sections 106 is completed, the process of arranging the cover film 110 at an appropriate position is required. The arrangement process of the cover film 110 includes the elevating of the cover film 110, the feed of the cover film 110, the horizontal movement of the cover film 110, and the lowering of the cover film 110. Of these processes, the feed and the horizontal movement of the cover film 110 may be performed in parallel.

Meanwhile, as is clear from the above description, in the mounting apparatus 10 disclosed in the specification, the film arrangement mechanism 18 is arranged on the base 16. In addition, the cover film 110 is arranged to cover a plurality of mounting sections 106 from above at the same time. The reason for this configuration is described in comparison with the related art.

Figure 17:
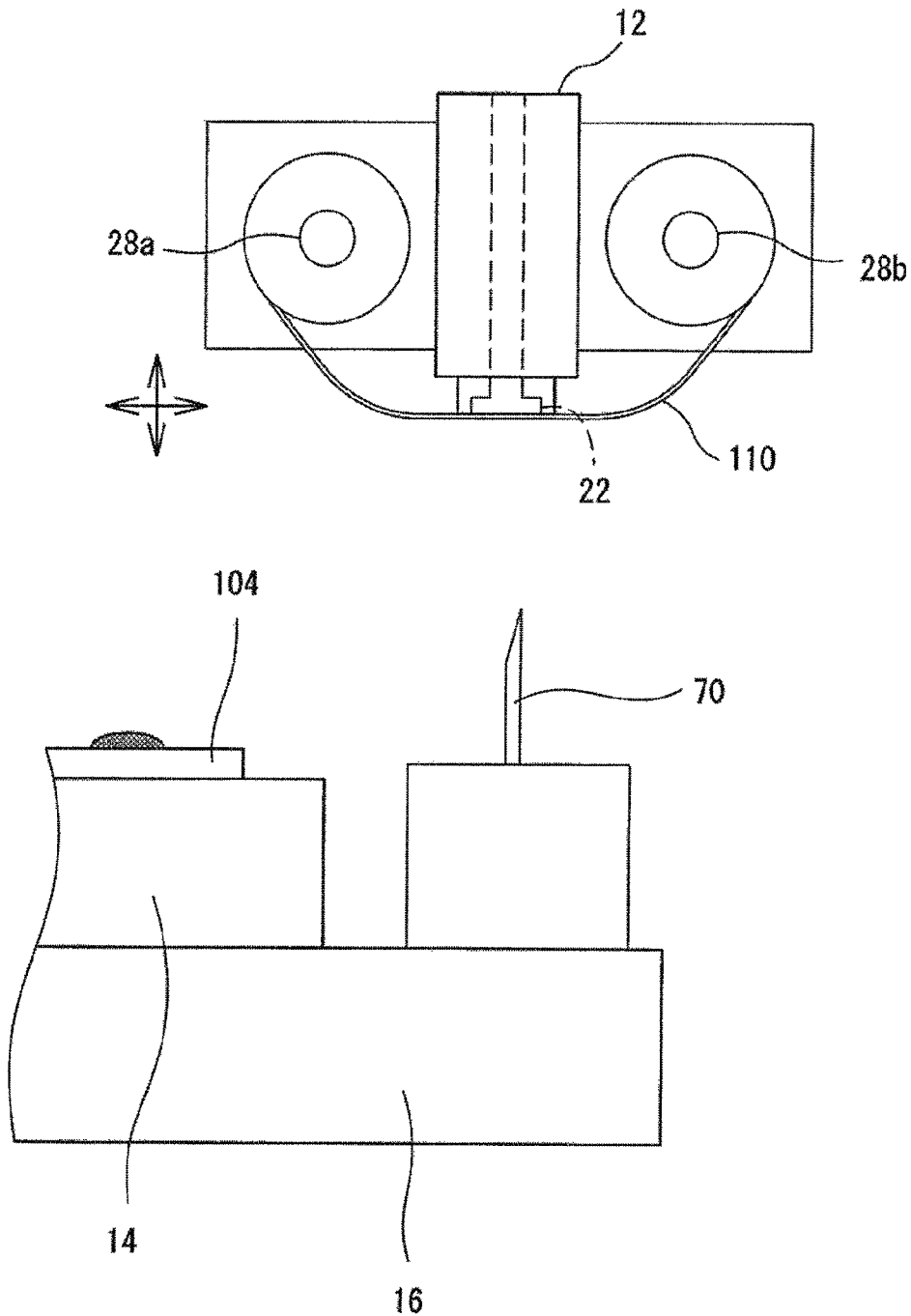
FIG. 17 is a diagram showing an example of a conventional mounting apparatus.

Several mounting apparatuses 10 in which the cover film 110 is interposed between the mounting head 12 and the semiconductor chip 100 have been proposed before. FIG. 17 is a diagram showing an example of this conventional mounting apparatus 10. As shown in FIG. 17, in many of the conventional mounting apparatuses 10, the cover film 110 is arranged on the mounting head 12. That is, the feed rollers for feeding the cover film 110 are attached to the mounting head 12. In this case, the weight of the mounting head 12 that requires a high-speed and high-precision movement is increased, causing problems that the movement mechanism for moving the mounting head 12 becomes large-sized and high-cost.

In addition, in the case of the configuration in which the cover film 110 is attached to the mounting head 12, the cover film 110 always covers the bottom surface of the mounting head 12. In this case, because the suction hole 22 of the mounting head 12 is covered with the cover film 110, the semiconductor chip 100 cannot be suction-held via the suction hole 22. Thus, in the conventional mounting apparatus 10, before the semiconductor chip 100 is suction-held, a hole is formed, using a needle 70 or the like, in the cover film 110 at a location corresponding to the suction hole 22. In addition, in the case of the configuration where the cover film 110 is attached to the mounting head 12, the cover film 110 is required to be fed each time the final press-attachment to one semiconductor chip 100 is completed. This hole-making process and the feed process take a long time, which causes an increase in the tact time. For example, as compared with the time required for bonding (the temporary press-attachment and the final press-attachment) once, the time required for the hole-making process and the feed process is several to ten times. In the conventional mounting apparatus 10, because this hole-making process occurs and the number of times of the feed process increases, the tact time of semiconductor apparatus manufacturing is increased.

On the other hand, as described above, the mounting apparatus 10 disclosed in the specification has the film arrangement mechanism 18 installed on the base 16. As a result, the mounting head 12 can be reduced in weight, and the mounting head 12 can be moved at a high speed and with high precision even with a relatively small and inexpensive movement mechanism.

In addition, by arranging the film arrangement mechanism 18 on the base 16, the cover film 110 and the mounting head 12 can be separated. Thus, the semiconductor chip 100 can be suction-held by the mounting head 12 without making a hole in the cover film 110. As a result, the time-consuming hole-making process is not required, and the tact time can be greatly reduced. In addition, because a complicated mechanism for making the hole is not required, the cost of the mounting apparatus 10 can also be reduced.

Furthermore, in the mounting apparatus 10 of the example, the cover film 110 is configured to cover a plurality of semiconductor chips 100 at the time of the final press-attachment process. Thus, the number of times for feeding the cover film 110 can be greatly reduced as compared with the related art, and the tact time can be greatly reduced.

Figure 10:
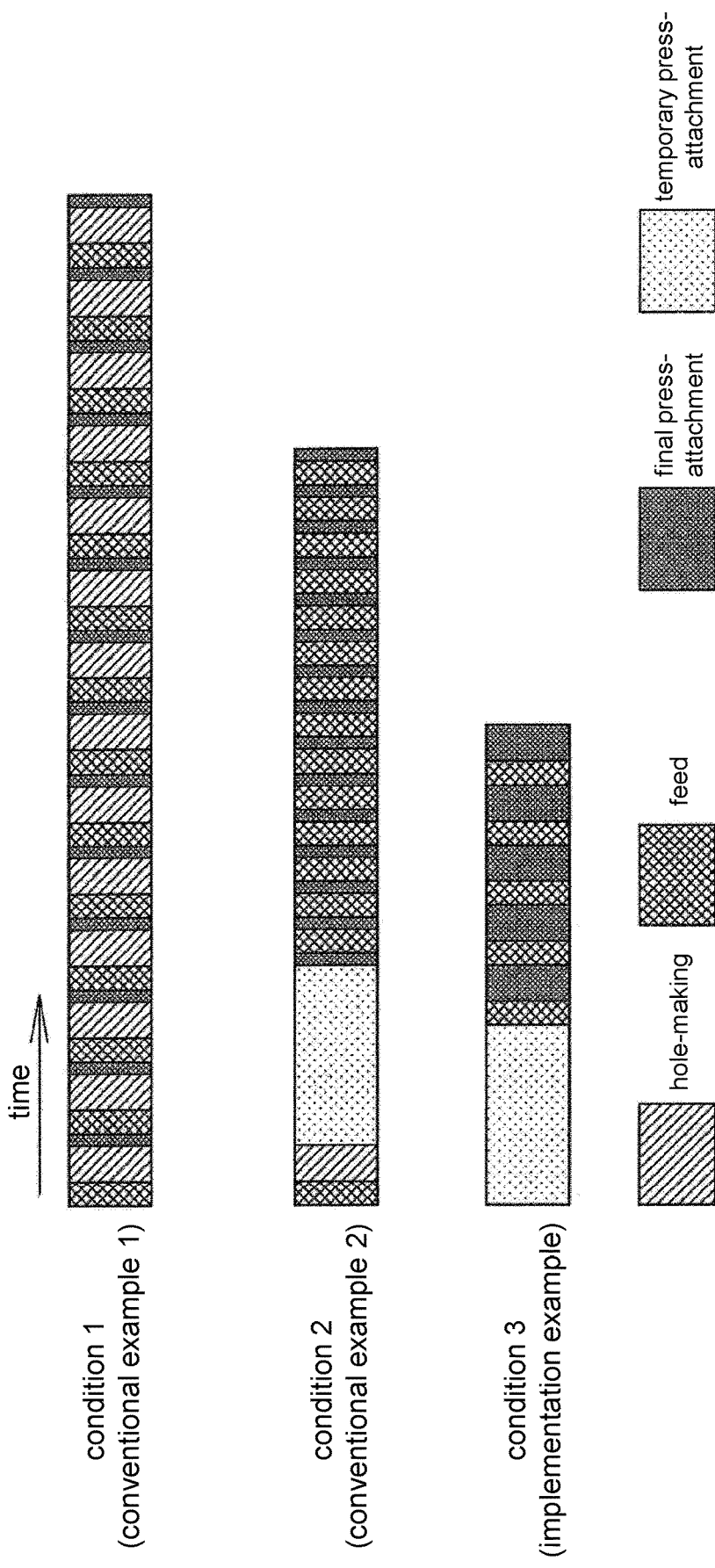
FIG. 10 is a diagram comparing the processing time of the conventional technique and the example.

This is described with a specific example. FIG. 10 is a diagram showing an example of a time chart when the semiconductor chips 100 are mounted in an array of three rows and five columns. In FIG. 10, condition 1 and condition 2 indicate a time chart in the conventional mounting apparatus 10, and condition 3 indicates a time chart in the mounting apparatus 10 disclosed in the specification. In the example of FIG. 10, the time required for the bonding (temporary press-attachment or final press-attachment) of one semiconductor chip 100 is one second, the time required for making a hole in the cover film 110 is three seconds, and the time required for the feed of the cover film 110 is two seconds. In addition, in FIG. 10, the temporary press-attachment is shown by light black ink, the final press-attachment is shown by dark black ink, the hole-making is shown by diagonal hatching, and the feed is shown by cross hatching.

There are roughly two procedures for mounting the semiconductor chip 100 in the conventional mounting apparatus 10. One is a procedure in which, after the semiconductor chip 100 is transported and placed on the substrate 104 by the mounting head 12, the final press-attachment is performed immediately without temporary press-attachment. Condition 1 in FIG. 10 shows a time chart in this procedure. In this case, each time one semiconductor chip 100 is finally press-attached, the hole-making (the diagonal hatching) and the feed (the cross hatching) of the cover film 110 must be performed. Thus, the time of the entire mounting process becomes extremely long.

Another procedure is a procedure in which, similarly to the mounting apparatus 10 disclosed in the specification, after all the semiconductor chips 100 are continuously temporarily press-attached, all the semiconductor chips 100 are continuously finally press-attached. Condition 2 in FIG. 10 shows a time chart in this procedure. In this case, because the hole-making of the cover film 110 only needs to be performed once before the first semiconductor chip 100 is temporarily press-attached, the total time required for the hole-making (the diagonal hatching) can be greatly reduced as compared with the first procedure. However, even in this case, the feed (the cross hatching) of the cover film 110 is required each time one semiconductor chip 100 is finally press-attached. In other words, the feed of the cover film 110 is required to be performed for the same number of times as the number of the semiconductor chips 100. As a result, the time of the entire mounting process cannot be greatly reduced.

On the other hand, in the mounting apparatus 10 disclosed in the specification, as described above, the hole-making (the diagonal hatching) of the cover film 110 is completely unnecessary. In addition, the cover film 110 simultaneously covers a plurality (three in the example) of the mounting sections 106. Thus, it is sufficient to perform the feed (the cross hatching) of the cover film 110 when the final press-attachment is performed three times. In other words, in the example, when the number of mounting sections 106 simultaneously covered by the cover film 110 is N, the number of times for feeding the cover film 110 is (a total number of the mounting sections 106/N). That is, according to the example, the number of times for feeding the cover film 110 can be greatly reduced as compared with the related art, and then the time of the entire mounting process can be greatly reduced. Here, in order to facilitate the description, the number N of the mounting sections 106 covered with the cover film 110, that is, the number N of the mounting sections 106 arranged in one column on the substrate 104 is three. However, in practice, the number N of the mounting sections 106 arranged in one column on the substrate 104 is often larger. Besides, because the number of times for feeding is reduced as the number N increases, it can be seen that the effect of shortening the tact time is higher for a large-sized substrate 104 having a large number of mounting sections 106.

Figure 11A:
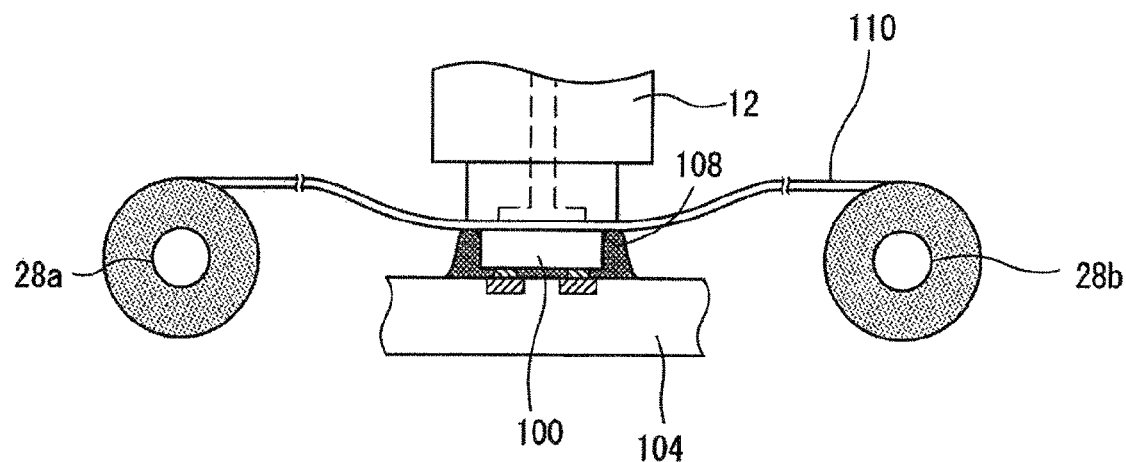
FIG. 11A is a diagram showing an example of another mounting apparatus.
Figure 11B:
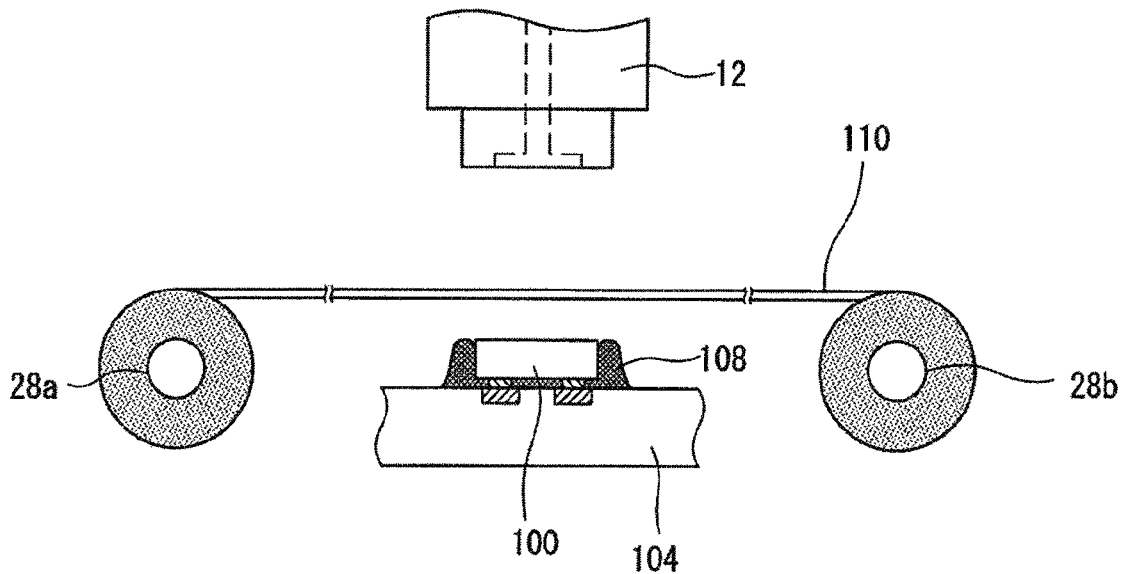
FIG. 11B is a diagram showing another state of the mounting apparatus in FIG. 11A.

Moreover, the above description is an example, and if at least the film arrangement mechanism 18 which arranges the cover film 110 at the appropriate position is installed as necessary on the bonding stage 14 or the base 16 supporting the bonding stage 14, other configurations may be appropriately changed. For example, in the above description, in order to make the cover film 110 and the upper surface of the semiconductor chip 100 come into contact or separate from each other, the film elevating mechanism for elevating or lowering the cover film 110 is arranged. However, if the cover film 110 and the upper surface of the semiconductor chip 100 can be separated when the cover film 110 is fed, the film elevating mechanism may not be arranged. For example, a configuration may be employed in which the cover film 110 is returned, utilizing the elasticity of the cover film 110, from a state of being in contact with the semiconductor chip 100 to a state of being separated from the semiconductor chip 100. Specifically, as shown in FIG. 11B, the cover film 110 is extended at a height position separated from the upper surface of the semiconductor chip 100. Then, at the time of the final press-attachment, as shown in FIG. 11A, the cover film 110 is bent by being pressed by the mounting head 12 and comes into contact with the upper surface of the semiconductor chip 100. At this time, if the cover film 110 has sufficient elasticity (resilience) and an appropriate tension is applied, when the pressing by the mounting head 12 is released, the cover film 110 automatically returns, due to an elastic restoring force, to the state before bending, that is, the state of being separated from the semiconductor chip 100. Then, the cover film 110 may be fed in this state. With this configuration, it is unnecessary to elevate or lower the cover film 110 each time the feed is performed, and the control of the mounting process can be further simplified.

Figure 12A:
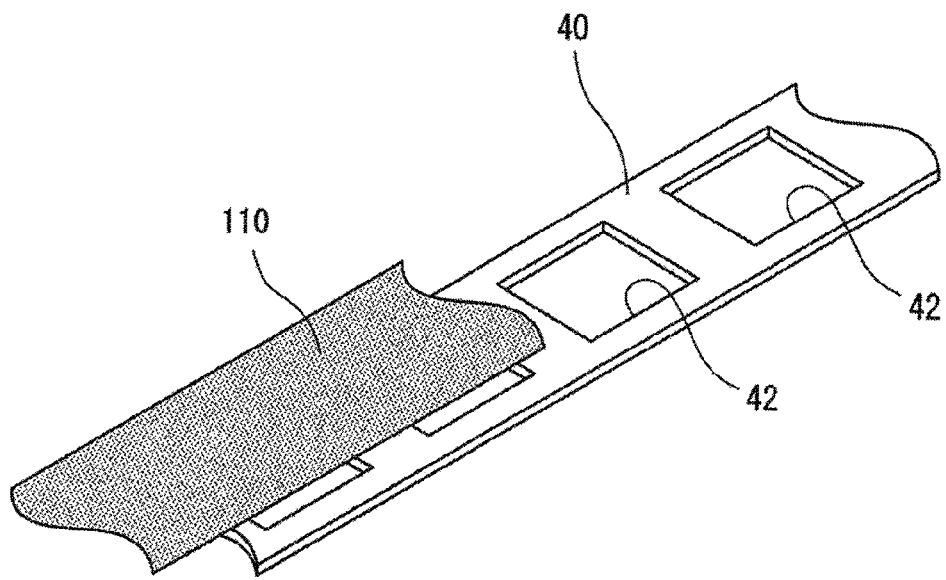
FIG. 12A is a perspective view of an interference member used in another mounting apparatus.
Figure 12B:
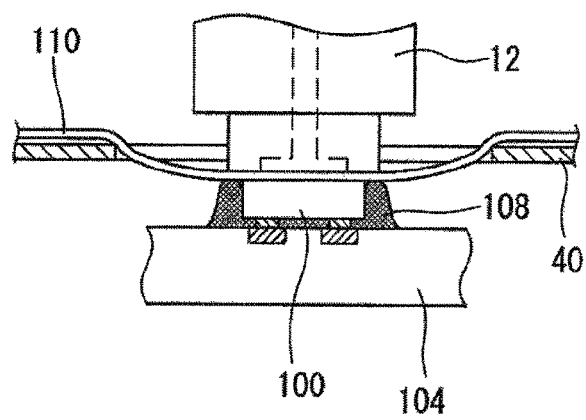
FIG. 12B is a diagram showing an example of the mounting apparatus which uses the interference member in FIG. 12A.

In addition, in order to more reliably separate the cover film 110 from the semiconductor chip 100, an interference member 40 may be arranged that interferes with a part of the cover film 110 bent downward by being pressed by the mounting head 12. The interference member 40 is required to interfere with a part of the cover film 110 which is bent downward, but not to interfere with the mounting head 12 lowered toward the semiconductor chip 100. Therefore, for example, as shown in FIG. 12A, a substantially ladder-like member in which rectangular holes 42 larger than the bottom surface of the mounting head 12 are formed at the intervals of the mounting sections 106 can be used as the interference member 40. When the interference member 40 is arranged, as shown in FIG. 12B, the cover film 110 pressed by the mounting head 12 is bent at a steeper slope as compared with the case that the interference member 40 is not arranged, and the elastic restoring force works more strongly. As a result, the cover film 110 is more reliably separated from the semiconductor chip 100. Moreover, the shape of the interference member 40 shown in FIGS. 12A and 12B is an example, and other shapes are evidently possible.

Figure 13:
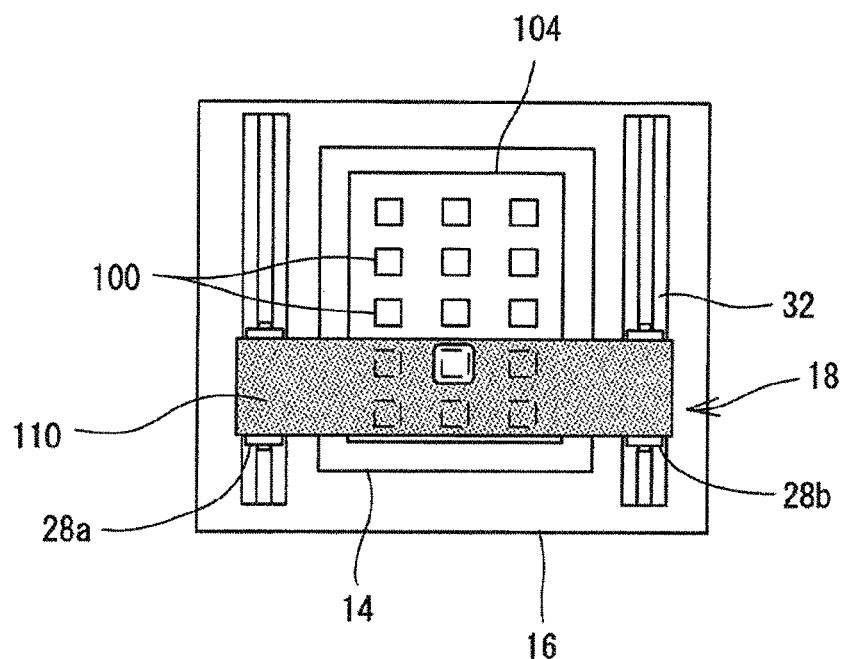
FIG. 13 is a diagram showing an example of another mounting apparatus.

In addition, in the above description, the width of the cover film 110 is the width of one column of the mounting sections 106; however, the width of the cover film 110 may be larger. For example, as shown in FIG. 13, the cover film 110 may have a width corresponding to two columns of the mounting sections 106. With this configuration, the number of the mounting sections 106 that can be simultaneously covered by the cover film 110 increases, and thus the number of times for feeding can be further reduced, and the tact time can be further shortened consequently. Moreover, in order to simplify the control of the arrangement of the cover film 110, the film feed-out mechanism 24 desirably extends the cover film 110 in a manner that the cover film 110 covers the two-dimensional array mounting sections 106 in columns.

Figure 14:
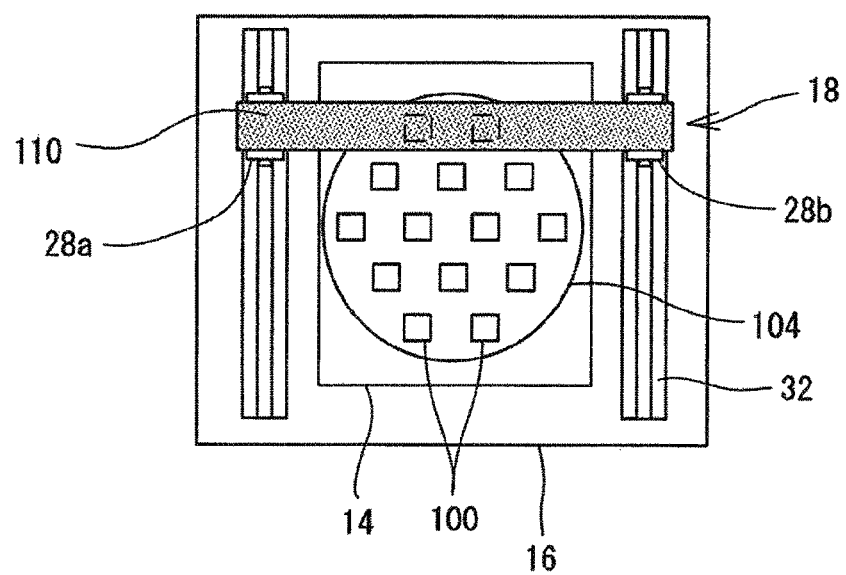
FIG. 14 is a plan view showing a situation where a circular substrate is used.

In addition, in the above description, only the mounting on the substantially rectangular substrate 104 is illustrated, but the substrate 104 is not limited to a rectangular shape and may have another shape, for example, a circular shape or the like. Therefore, the mounting apparatus 10 disclosed in the specification may be applied to a CoW (Chip On Wafer) in which the semiconductor chips 100 are bonded to a substantially circular wafer. Moreover, in the case of a circular substrate 104, as shown in FIG. 14, the number of the mounting sections 106 that can be simultaneously covered by the cover film 110 is changed according to the horizontal position of the cover film 110. In this case, the feeding distance of the cover film 110 may be changed according to the horizontal position of the cover film 110 (the number of the mounting sections 106 that can be simultaneously covered). With this configuration, loss of the cover film 110 can be reduced. In addition, as another embodiment, the feeding distance of the cover film 110 may be fixed to a maximum value, that is, equivalent to the diameter of the substrate 104. In this case, the cover film 110 to be wound without being used is increased, but the feed control of the cover film 110 can be simplified.

Figure 15:
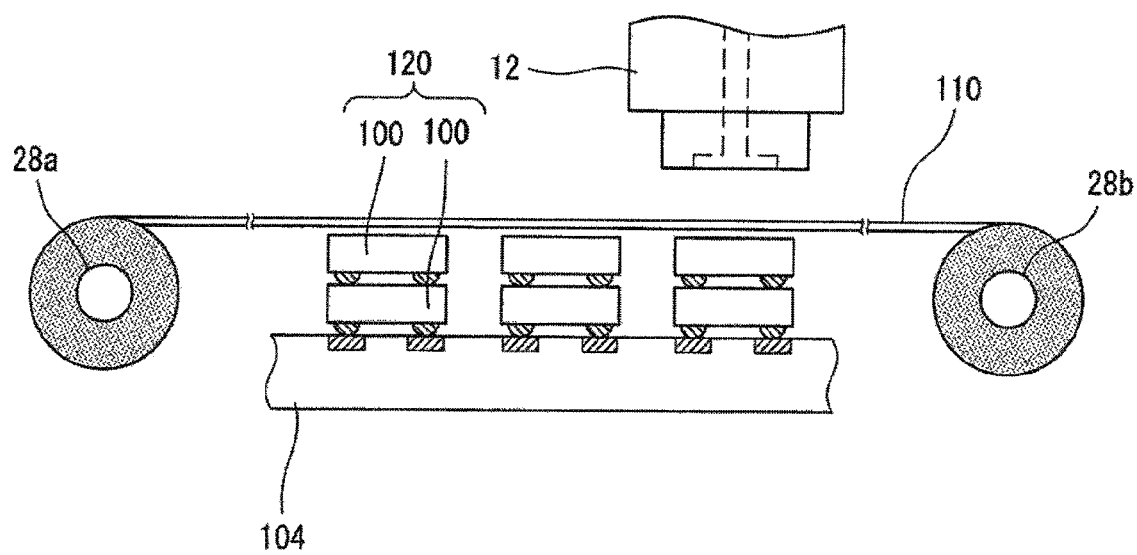
FIG. 15 is a side view showing a situation where semiconductor chips are laminated and mounted.

In addition, in the above, only the embodiment is illustrated in which the semiconductor chips 100 are mounted on the substrate 104 one by one. However, as shown in FIG. 15, two or more semiconductor chips 100 may be laminated and mounted in a thickness direction. That is, in this case, for the first semiconductor chip 100, the substrate 104 is the mounted body, and for the second semiconductor chip 100, the first-stage semiconductor chip 100 is the mounted body.

In this case, in a temporary press-attachment process, first, a temporary laminated body 120 in which a plurality of semiconductor chips 100 is temporarily press-attached and laminated in the thickness direction is formed in each mounting section 106. Thereafter, in a final press-attachment process, an upper surface of the temporary laminated body 120 is heated and pressed by the mounting head 12, and thereby the plurality of semiconductor chips 100 configuring the temporary laminated body 120 is finally press-attached at once. In this manufacturing embodiment, the cover film 110 may also be retracted to a retracted position at the time of the temporary press-attachment process, and the cover film 110 may also be arranged at an intermediate position between the semiconductor chip 100 to be finally press-attached and the mounting head 12 at the time of the final press-attachment process.

Figure 16:
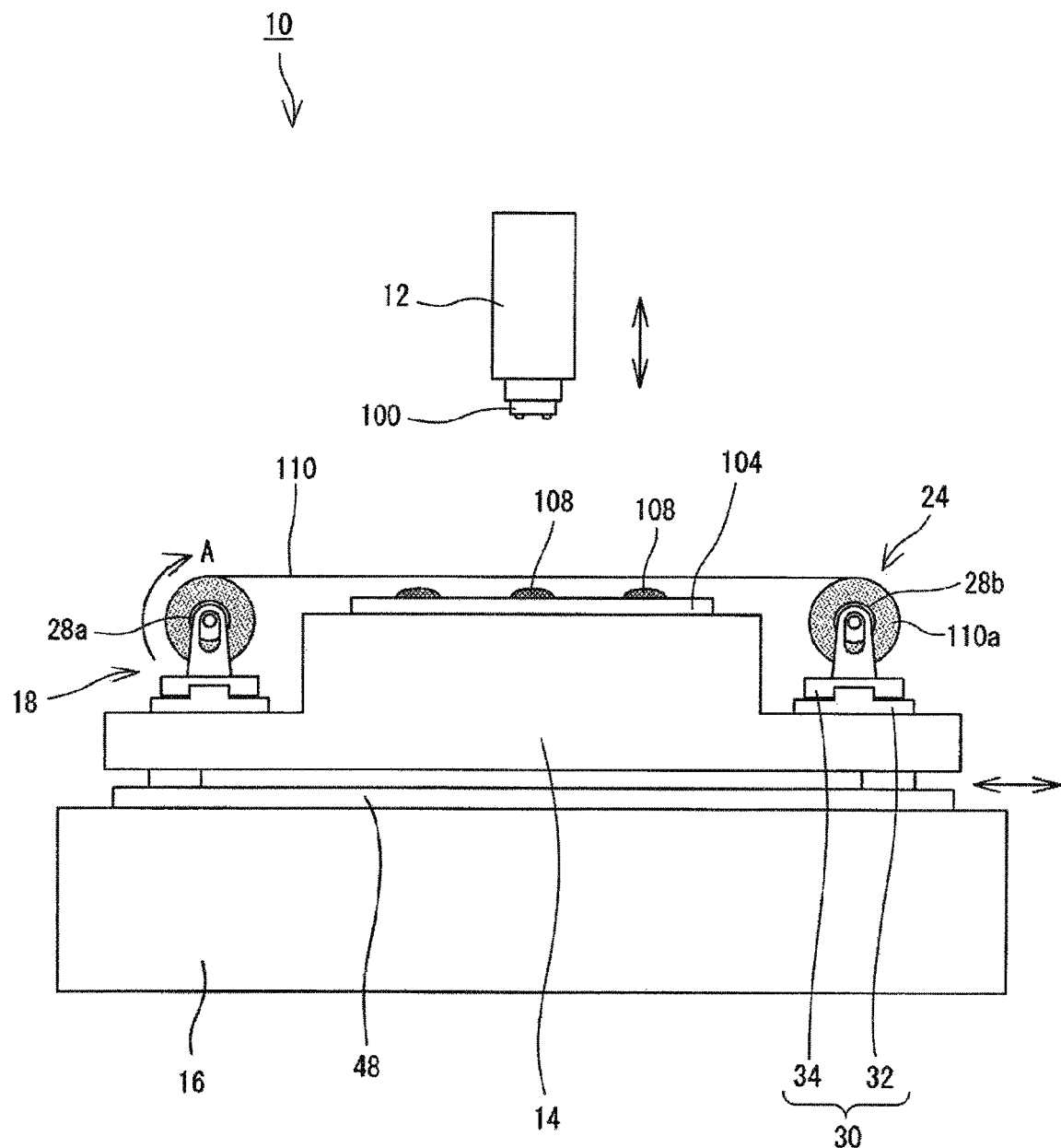
FIG. 16 is a diagram showing an example of another mounting apparatus.

In addition, in the above, the configuration in which the mounting head 12 is moved in the horizontal direction is illustrated. However, a configuration may be employed in which the bonding stage 14 is moved in the horizontal direction instead of the mounting head 12. FIG. 16 is a diagram showing an example of a mounting apparatus 10 in which the bonding stage 14 is moved horizontally. In the example, the bonding stage 14 includes an XY table 48 that allows movement in a first direction (the long direction of the substrate 104) and movement in a second direction (the short direction of the substrate 104). In this case, the controller 20 drives the XY table 48 to move the bonding stage 14 horizontally in a manner that the mounting sections 106 to be temporarily press-attached and finally press-attached to are positioned below the mounting head 12. Then, the mounting head 12 is lowered directly downward, and thereby the semiconductor chips 100 are temporarily press-attached or finally press-attached to the mounting sections 106. Moreover, in this case, because the mounting head 12 is only elevated or lowered and is not moved horizontally, a supply mechanism for supplying a new semiconductor chip 100 or the like is desirably arranged in the mounting head 12. In addition, in this case, the film arrangement mechanism 18 is desirably installed on the bonding stage 14 so as to be capable of moving horizontally in conjunction with the substrate 104.

In addition, in the above, the coating first method of coating the adhesive material 108 in advance to the mounting sections 106 is illustrated. However, the mounting apparatus 10 disclosed in the specification is not limited to the coating first method, and as long as the semiconductor chip 100 is mounted on the mounted body via the adhesive material 108, the present invention may be applied to another bonding method. For example, an adhesive called DAF (die attach film) may be attached to a back surface of the semiconductor chip 100 instead of the mounted body, and the DAF may be heated and cured to mount the semiconductor chip 100 on the mounted body. In this case, by interposing the cover film 110 between the semiconductor chip 100 and the mounting head 12, the fume gas can also be effectively prevented from entering the mounting head 12.

What is claimed is:

1. A mounting apparatus which mounts a semiconductor chip to a mounted body which is a substrate or another semiconductor chip via an adhesive material, comprising:
   a bonding stage on which the substrate is placed;
   a base supporting the bonding stage;
   a mounting head for performing a temporary press-attachment process in which the semiconductor chip is suction-held and temporarily press-attached to the mounted body and a final press-attachment process in which the temporarily press-attached semiconductor chip is finally press-attached;
   a film arrangement mechanism which is disposed on a top surface of the bonding stage or the base and interposes a cover film between the temporarily press-attached semiconductor chip and the mounting head at the time of the final press-attachment process; and
   a controller which controls a driving of the mounting head and the film arrangement mechanism, wherein
   the film arrangement mechanism comprises:
   a film feed-out mechanism which has a pair of rollers with the cover film extended there-between and successively feeds out a new cover film; and
   a film movement mechanism, comprising a rail and a movement block, moving the pair of rollers in a horizontal direction with respect to the mounting head.

2. The mounting apparatus according to claim 1, wherein the controller is configured to control the film movement mechanism in a manner that, during the temporary press-attachment process, the cover film is positioned at a retracted position horizontally separated from mounting sections where the semiconductor chip is temporarily press-attached, and during the final press-attachment process, the cover film is positioned at an intermediate position directly above the semiconductor chip to be finally press-attached.

3. The mounting apparatus according to claim 2, wherein the film feed-out mechanism extends the cover film in a manner that the cover film covers a plurality of the mounting sections, in which the final press-attachment process is performed by dividing into multiple final press-attachment processes, from above in the intermediate position; and
until the multiple final press-attachment processes are completed, the controller neither moves nor feeds the cover film so that the cover film is positioned in the intermediate position to be in an idling status,
when the multiple final press-attachment processes are completed, the controller drives the film movement mechanism and moves the film movement mechanism to the position where the cover film covers a plurality of new mounting sections from above, and the controller drives the film feed-out mechanism and feeds the cover film by a distance corresponding to the plurality of mounting sections.

4. The mounting apparatus according to claim 3, wherein the mounting sections for mounting the semiconductor chip are defined in a two-dimensional array shape on the substrate, and
the film feed-out mechanism extends the cover film to cover the two-dimensional array-shaped mounting sections in columns.

5. The mounting apparatus according to claim 3, wherein the controller causes the mounting head to continuously execute the temporary press-attachment of the semiconductor chip in the plurality of mounting sections, and then causes the mounting head to continuously execute the final press-attachment of a plurality of temporarily press-attached semiconductor chips.

6. The mounting apparatus according to claim 1, wherein the film arrangement mechanism further comprises an elevating mechanism which elevates or lowers the cover film with respect to the bonding stage.

7. The mounting apparatus according to claim 1, wherein the film feed-out mechanism comprises an interference member which interferes with a part of the cover film pressed and bent downward by the mounting head to thereby assist in eliminating the bending.

* * * * *